(12) United States Patent
Chen et al.

(10) Patent No.: US 11,805,899 B2
(45) Date of Patent: Nov. 7, 2023

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/536,435

(22) Filed: Nov. 29, 2021

(65) Prior Publication Data
US 2022/0079340 A1    Mar. 17, 2022

Related U.S. Application Data

(63) Continuation of application No. 16/716,606, filed on Dec. 17, 2019, now Pat. No. 11,213,123.

(30) Foreign Application Priority Data

Aug. 19, 2019 (TW) ................. 108129735

(51) Int. Cl.
*A47B 88/43* (2017.01)
*A47B 88/49* (2017.01)

(52) U.S. Cl.
CPC .............. *A47B 88/43* (2017.01); *A47B 88/49* (2017.01)

(58) Field of Classification Search
CPC ....... A47B 88/43; A47B 88/49; A47B 88/427; A47B 57/32; A47B 57/34; A47B 57/54; A47B 96/07; H05K 7/183; H05K 7/18; F16C 29/12
USPC .......................................... 411/100, 367, 546
See application file for complete search history.

(56) References Cited

U.S. PATENT DOCUMENTS

| | | | |
|---|---|---|---|
| 858,420 A | | 7/1907 | Schneider |
| 2,594,571 A | * | 4/1952 | Lundberg ............... A47B 88/43 312/334.4 |
| 3,059,986 A | * | 10/1962 | Miller, Jr. .............. A47B 88/49 312/334.8 |
| 4,331,369 A | | 5/1982 | Lazar et al. |
| 4,712,927 A | * | 12/1987 | Arrendiell ............... F16C 29/02 384/49 |
| 5,257,861 A | | 11/1993 | Domenig et al. |
| 5,387,033 A | | 2/1995 | Domenig |
| 5,457,867 A | | 10/1995 | Maberry et al. |
| 5,571,256 A | | 11/1996 | Good et al. |
| 5,626,450 A | | 5/1997 | Ferrari et al. |
| 5,669,108 A | | 9/1997 | Ferrari et al. |
| 5,899,428 A | * | 5/1999 | Gauger ................ B60N 2/0715 248/419 |

(Continued)

FOREIGN PATENT DOCUMENTS

JP         2002017485 A       1/2002

*Primary Examiner* — Christopher Garft (57) ABSTRACT

A slide rail assembly includes a rail member and a mounting structure. The rail member has an installation feature arranged in a transverse direction relative to a longitudinal direction of the rail member. The mounting structure is mounted to the installation feature of the rail member. The rail member and the mounting structure are transversely movable relative to each other.

8 Claims, 10 Drawing Sheets

(56) References Cited

U.S. PATENT DOCUMENTS

| | | | |
|---|---|---|---|
| 5,906,080 A * | 5/1999 | diGirolamo | E04B 2/96 52/656.1 |
| 6,739,019 B2 * | 5/2004 | Schnelle | E05D 5/0276 16/382 |
| 7,281,694 B2 | 10/2007 | Allen et al. | |
| 7,604,307 B2 * | 10/2009 | Greenwald | A47B 88/49 312/334.46 |
| 8,028,965 B2 | 10/2011 | Chen et al. | |
| 8,181,419 B1 * | 5/2012 | diGirolamo | E04B 2/768 52/712 |
| 8,458,972 B1 * | 6/2013 | Stodola | E04B 2/825 52/284 |
| 9,211,008 B2 | 12/2015 | Chen et al. | |
| 9,383,038 B2 | 7/2016 | Chen et al. | |
| 9,538,844 B2 | 1/2017 | Chen et al. | |
| 9,675,173 B2 | 6/2017 | Chen et al. | |
| 9,693,628 B2 | 7/2017 | Chen et al. | |
| 9,867,308 B2 | 1/2018 | Chen et al. | |
| 10,015,902 B2 | 7/2018 | Chen et al. | |
| 10,136,548 B2 | 11/2018 | Chen et al. | |
| 10,149,402 B1 | 12/2018 | Dufresne et al. | |
| 10,159,343 B2 | 12/2018 | Chen et al. | |
| 10,292,495 B2 | 5/2019 | Anderson et al. | |
| 10,314,394 B2 | 6/2019 | Chen et al. | |
| 10,334,950 B2 | 7/2019 | Chen et al. | |
| 10,398,226 B2 | 9/2019 | Chen et al. | |
| 10,660,436 B2 | 5/2020 | Chen et al. | |
| 10,674,820 B2 | 6/2020 | Chen et al. | |
| 10,716,398 B1 | 7/2020 | Chen et al. | |
| 2008/0031702 A1 | 2/2008 | Chen et al. | |
| 2013/0106271 A1 | 5/2013 | Anderson et al. | |
| 2015/0201752 A1 | 7/2015 | Chen et al. | |
| 2015/0211574 A1 | 7/2015 | Chen et al. | |
| 2018/0084907 A1 | 3/2018 | Chen et al. | |
| 2019/0246513 A1 | 8/2019 | Chen et al. | |
| 2021/0052072 A1 * | 2/2021 | Chen | A47B 88/493 |

* cited by examiner

SLIDE RAIL ASSEMBLY

CROSS REFERENCE TO RELATED APPLICATIONS

This is a continuation application of U.S. application Ser. No. 16/716,606, filed on Dec. 17, 2019.

BACKGROUND OF THE INVENTION

1. Field of the Invention

The present invention relates to a slide rail assembly, and more particularly, to a slide rail assembly applicable to a greater mounting tolerance.

2. Description of the Prior Art

In a rack system, a slide rail assembly is configured to be mounted to a rack. U.S. Pat. No. 8,028,965 B2 discloses a slide rail assembly having a front part and a rear part fixed to two posts of a rack through a connecting part (a bracket). A carried object (such as an electronic device or a drawer) can be mounted to the rack through the slide rail assembly.

In addition, no matter how the slide rail assembly is mounted to the rack, a mounting position of the slide rail assembly is usually fixed and cannot be moved once the slide rail assembly is mounted to the rack.

A distance between the two posts of the rack usually meets a predetermined specification. Therefore, there is a size limitation for the carried object. In other words, when a carried object has a different dimension (such as a different width), a position or a dimension (such as a width) of the slide rail assembly must be changed if necessary.

Therefore, it is important to develop a different slide rail product.

SUMMARY OF THE INVENTION

The present invention provides a slide rail assembly applicable to a greater mounting tolerance and configured to mount a carried object having a width limited within a certain range.

According to an embodiment of the present invention, a slide rail assembly comprises a rail member and a mounting structure. The rail member has a longitudinal body. The mounting structure is mounted to the rail member. The mounting structure comprises a connecting part and a supporting part. The connecting part is configured to mount the rail member to a target object. The supporting part is configured to allow the rail member to move transversely. At least one of the supporting part and the rail member is arranged with a blocking feature to allow the rail member to transversely move relative to the supporting part between a first predetermined position and a second predetermined position.

Preferably, the connecting part and the supporting part are two separate components.

Preferably, the connecting part and the supporting part are integrated into one component.

According to another embodiment of present invention, a slide rail assembly comprises a rail member and a mounting structure. The rail member has a longitudinal body. The longitudinal body is arranged with an installation hole. The mounting structure is configured to be inserted into the installation hole of the rail member. One of the rail member and the mounting structure comprises a first blocking feature, and the other one of the rail member and the mounting structure comprises a second blocking feature and a third blocking feature. The first blocking feature is arranged between the second blocking feature and the third blocking feature. A transverse width is defined between the second blocking feature and the third blocking feature. A thickness of the first blocking feature is smaller than the transverse width. The rail member and the mounting structure are transversely movable relative to each other within a limited range through arranging the first blocking feature between the second blocking feature and the third blocking feature.

Preferably, the rail member comprises the second blocking feature and the third blocking feature. The mounting structure comprises a supporting part and a connecting part. The supporting part comprises the first blocking feature. The supporting part has a through hole. The connecting part is configured to be inserted into the installation hole of the rail member and the through hole of the supporting part.

Preferably, the second blocking feature and the third blocking feature are arranged in the installation hole.

Preferably, the supporting part further comprises a main body part. The first blocking feature is connected to the main body part. A contour of the first blocking feature is greater than a contour of the main body part. The through hole penetrates through the first blocking feature and the main body part.

Preferably, the connecting part comprises a head section and a body section connected to the head section. The head section is greater than the body section. The body section of the connecting part is configured to be inserted into the installation hole of the rail member and the through hole of the supporting part.

Preferably, the supporting part is sleeved on an outer periphery of the head section of the connecting part.

Preferably, the body section of the connecting part is configured to be connected to a target object, and the supporting part is configured to provide support between the target object and the head section of the connecting part.

Preferably, the target object has a plurality of connecting features. The rail member is arranged with a reinforcing member. The reinforcing member is arranged with a plurality of mounting features configured to be mounted to the plurality of connecting features.

Preferably, the slide rail assembly further comprises an inner rail longitudinally movable relative to the rail member.

According to another embodiment of the present invention, a slide rail assembly comprises a mounting structure and a rail member. The mounting structure comprises a first blocking feature. The rail member has a longitudinal body. The longitudinal body is arranged with an installation hole transversely penetrating through the longitudinal body. The rail member comprises a second blocking feature and a third blocking feature. The first blocking feature is arranged between the second blocking feature and the third blocking feature. A transverse width is defined between the second blocking feature and the third blocking feature. The rail member and the mounting structure are transversely movable relative to each other within a limited range through arranging the first blocking feature between the second blocking feature and the third blocking feature.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
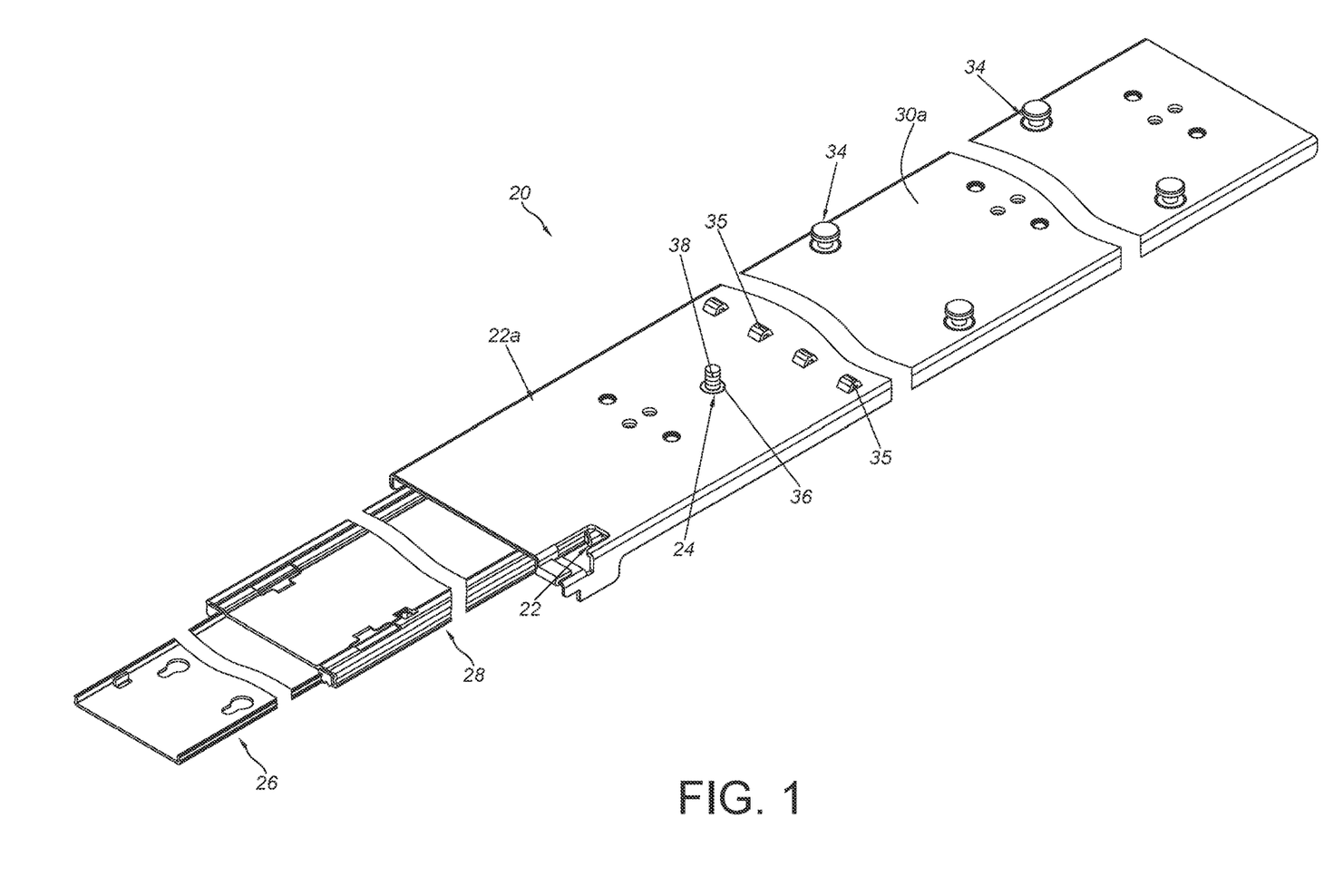
FIG. 1 is a diagram showing a slide rail assembly according to a first embodiment of the present invention.
Figure 2:
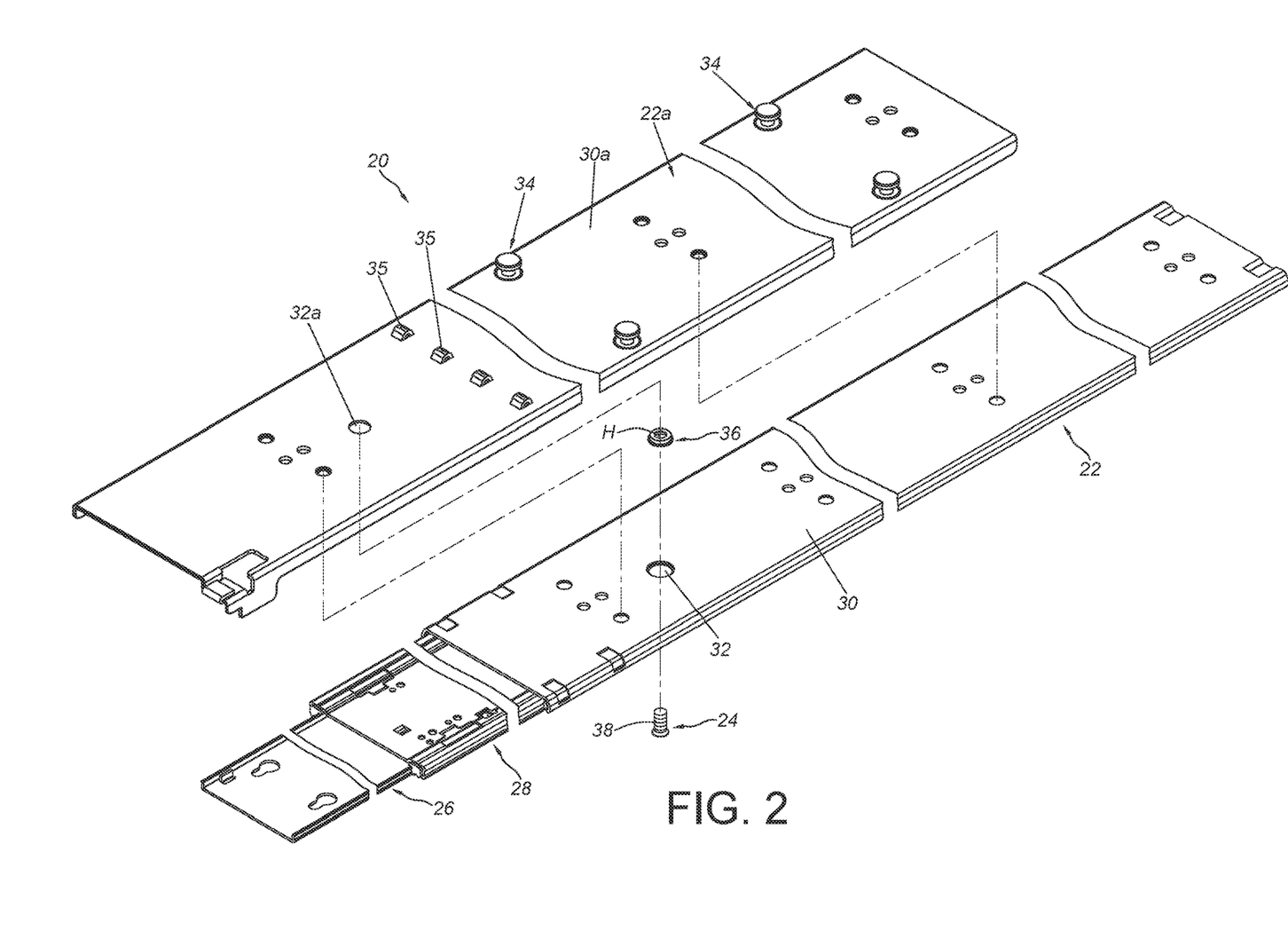
FIG. 2 is an exploded view of the slide rail assembly according to the first embodiment of the present invention.

As shown in FIG. 1 and FIG. 2, a slide rail assembly 20 comprises a rail member 22 (such as an outer rail) and a mounting structure 24 according to a first embodiment of the present invention. The rail member 22 is longitudinally arranged. Preferably, the slide rail assembly 20 further comprises a reinforcing member 22a, an inner rail 26 and a middle rail 28. The reinforcing member 22a is connected (such as fixedly connected) to the rail member 22 to be regarded as one part of the rail member 22. The reinforcing member 22a is configured to improve structural strength of the rail member 22. On the other hand, the middle rail 28 is movably mounted between the rail member 22 and the inner rail 26 to form a so-called three sectional slide rail assembly. But the number of rails of the slide rail assembly 20 in the present invention is not limited. The inner rail 26 is longitudinally movable relative to the rail member 22 through the middle rail 28.

Each of the rail member 22 and the reinforcing member 22a has a longitudinal body 30, 30a. The longitudinal bodies 30, 30a of the rail member 22 and the reinforcing member 22a are respectively arranged with installation features, such as installation holes 32, 32a communicated with each other, but the preset invention is not limited thereto. When the reinforcing member 22a is regarded as one part of the rail member 22, the installation holes 32, 32a can be regarded as a same installation hole 32. Preferably, the reinforcing member 22a is arranged with a plurality of mounting features 34, such as hanging pins, but the present invention is not limited thereto. Preferably, the reinforcing member 22a is further arranged with a plurality of supporting features 35. The supporting features 35 can be protrusions, but the present invention is not limited thereto.

The mounting structure 24 is configured to be mounted to the installation holes 32, 32a of the rail member 22 and the reinforcing member 22a. For example, the mounting structure 24 can be inserted into the installation holes 32, 32a of the rail member 22 and the reinforcing member 22a. Preferably, the mounting structure 24 comprises a supporting part 36 and a connecting part 38. In the first embodiment, the supporting part 36 and the connecting part 38 are two separate components, but the present invention is not limited thereto. Preferably, the supporting part 36 can be a sleeve, a washer, a gasket or the like, and the connecting part 38 can be a screw, but the present invention is not limited thereto. Moreover, in the first embodiment, the supporting part 36 of the mounting structure 24 can be movably mounted in the installation holes 32 in advance to be limited between the longitudinal bodies 30, 30a of the rail member 22 and the reinforcing member 22a. Thereby, the supporting part 36 can be prevented from being detached from the rail member 22.

Figure 3:
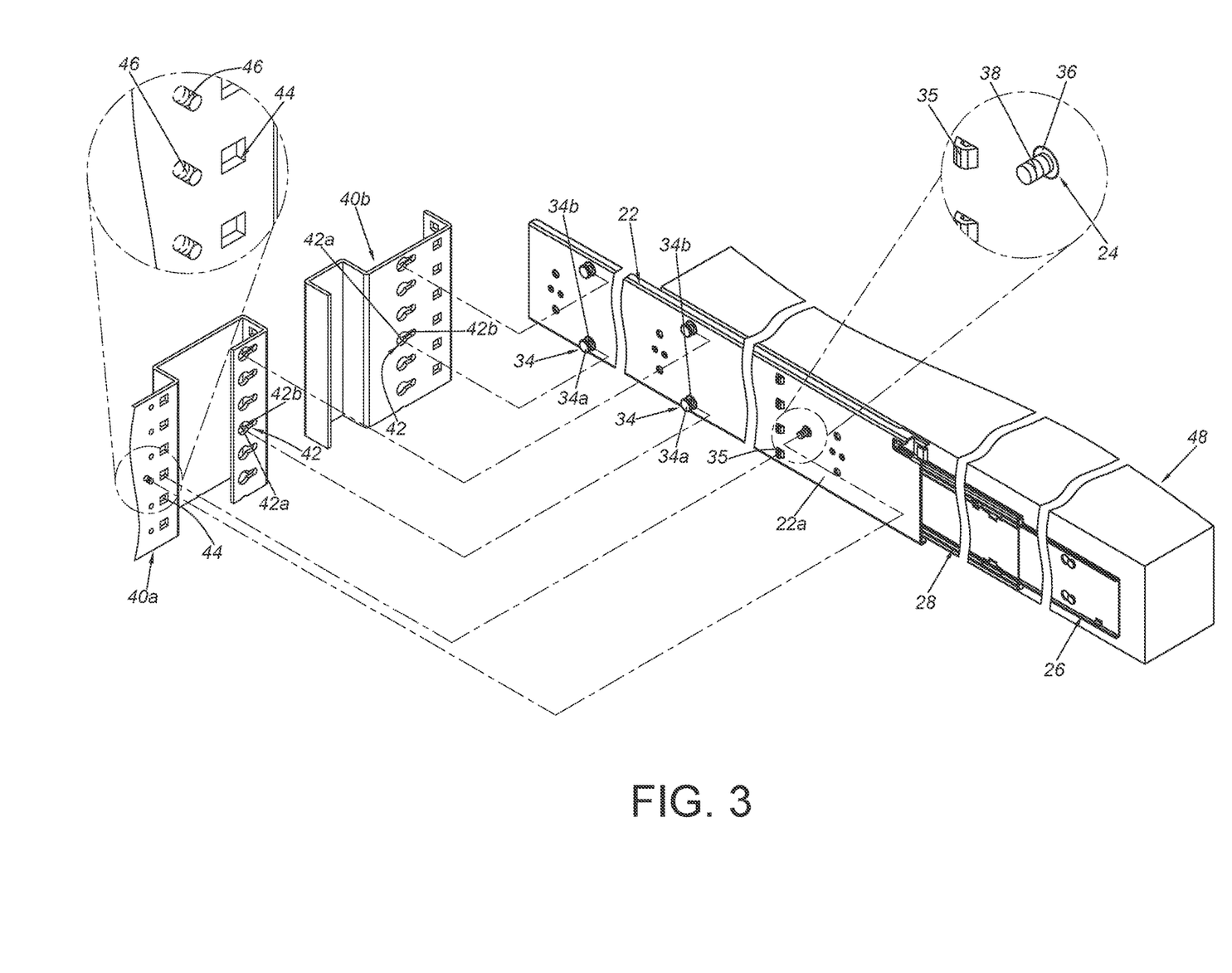
FIG. 3 is an exploded view of a rack and the slide rail assembly mounted with a carried object according to the first embodiment of the present invention.
Figure 4:
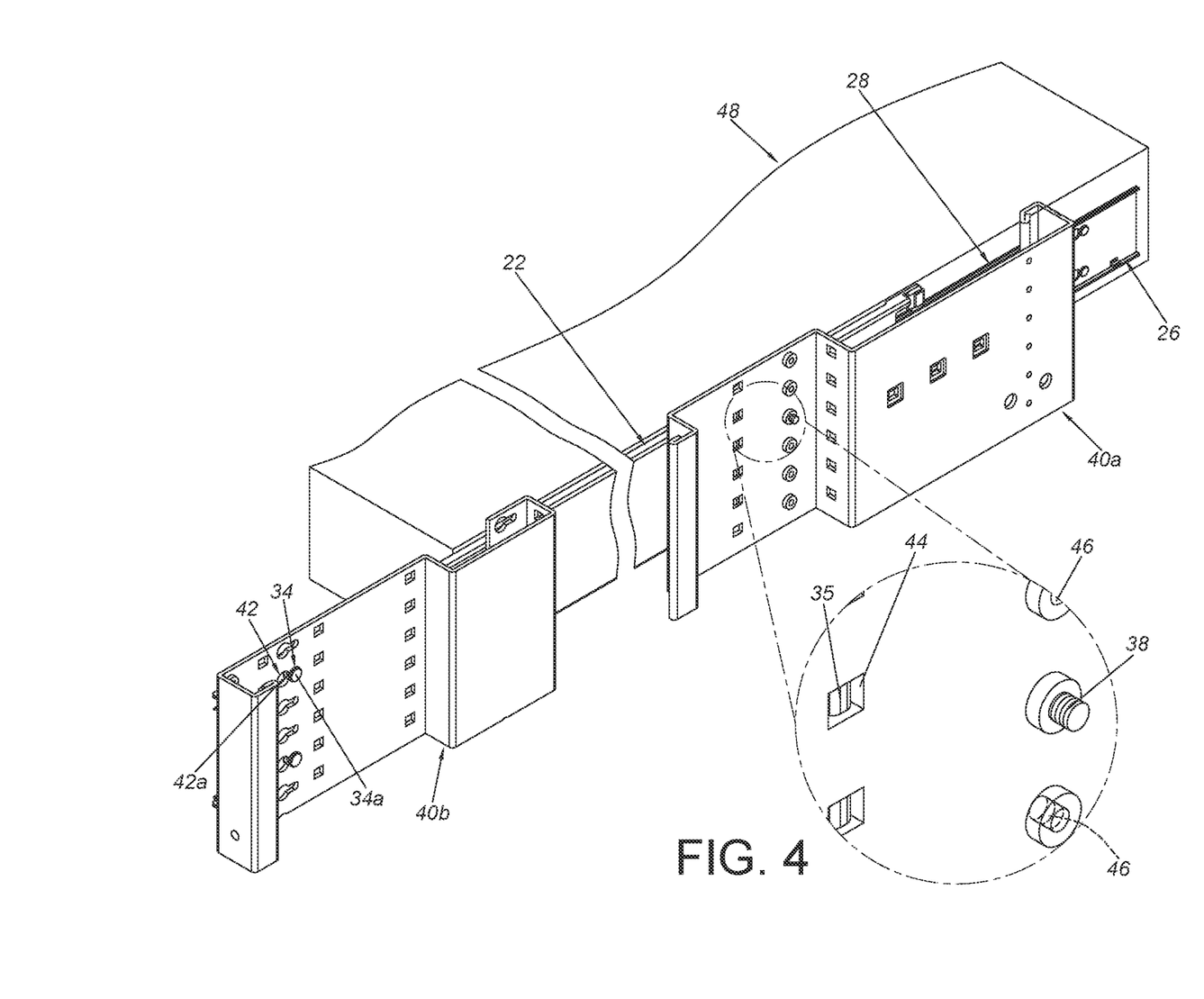
FIG. 4 is a diagram showing the carried object being mounted to the rack through the slide rail assembly according to the first embodiment of the present invention.

As shown in FIG. 3 and FIG. 4, the rail member 22 is configured to be mounted to at least one target object. The at least one target object can be at least one post of a rack. In the present embodiment, the at least one target object can be a first post 40a and a second post 40b of the rack, but the number of the posts in the present invention is not limited. Both of the first post 40a and the second post 40b have a plurality of connecting features 42 and a plurality of corresponding features 44. The connecting feature 42 can be a connecting hole, and the corresponding feature 44 can be a hole (or a recessed part), but the present invention is not limited thereto.

Furthermore, the plurality of mounting features 34 (such as hanging nails) of the reinforcing member 22a are configured to be mounted to the plurality of connecting features 42 (such as connecting holes) of one of the first post 40a and the second post 40b. Preferably, each of the mounting features 34 comprises a first mounting part 34a and a second mounting part 34b connected to the first mounting part 34a, and the first mounting part 34a is greater than the second mounting part 34b; and each of the connecting features 42 comprises a first hole part 42a and a second hole part 42b communicated with the first hole part 42a, and the first hole part 42a is greater than the second hole part 42b. The first mounting part 34a of the mounting feature 34 is configured to be inserted into the first hole part 42a of the connecting feature 42. When the first mounting part 34a of the mounting feature 34 is inserted into the first hole part 42a of the connecting feature 42, the second mounting part 34b of the mounting feature 34 is configured to be mounted to the second hole part 42b of the connecting feature 42 by slightly moving the reinforcing member 22a.

On the other hand, the plurality of supporting features 35 (such as protrusions) of the reinforcing member 22a are configured to be mounted to the plurality of corresponding features 44 (such as holes or recessed parts) of one of the first post 40a and the second post 40b. Preferably, the first post 40a has a plurality of screw holes 46, and the connecting part 38 of the mounting structure 24 can be screwed to one of the screw holes 46 of the first post 40a. When the connecting part 38 of the mounting structure 24 is screwed to one of the screw holes 46 of the first post 40a, the second mounting part 34b of the mounting feature 34 can be securely held in the second hole part 42b of the connecting feature 42. In addition, the inner rail 26 is configured to carry a carried object 48.

Figure 5:
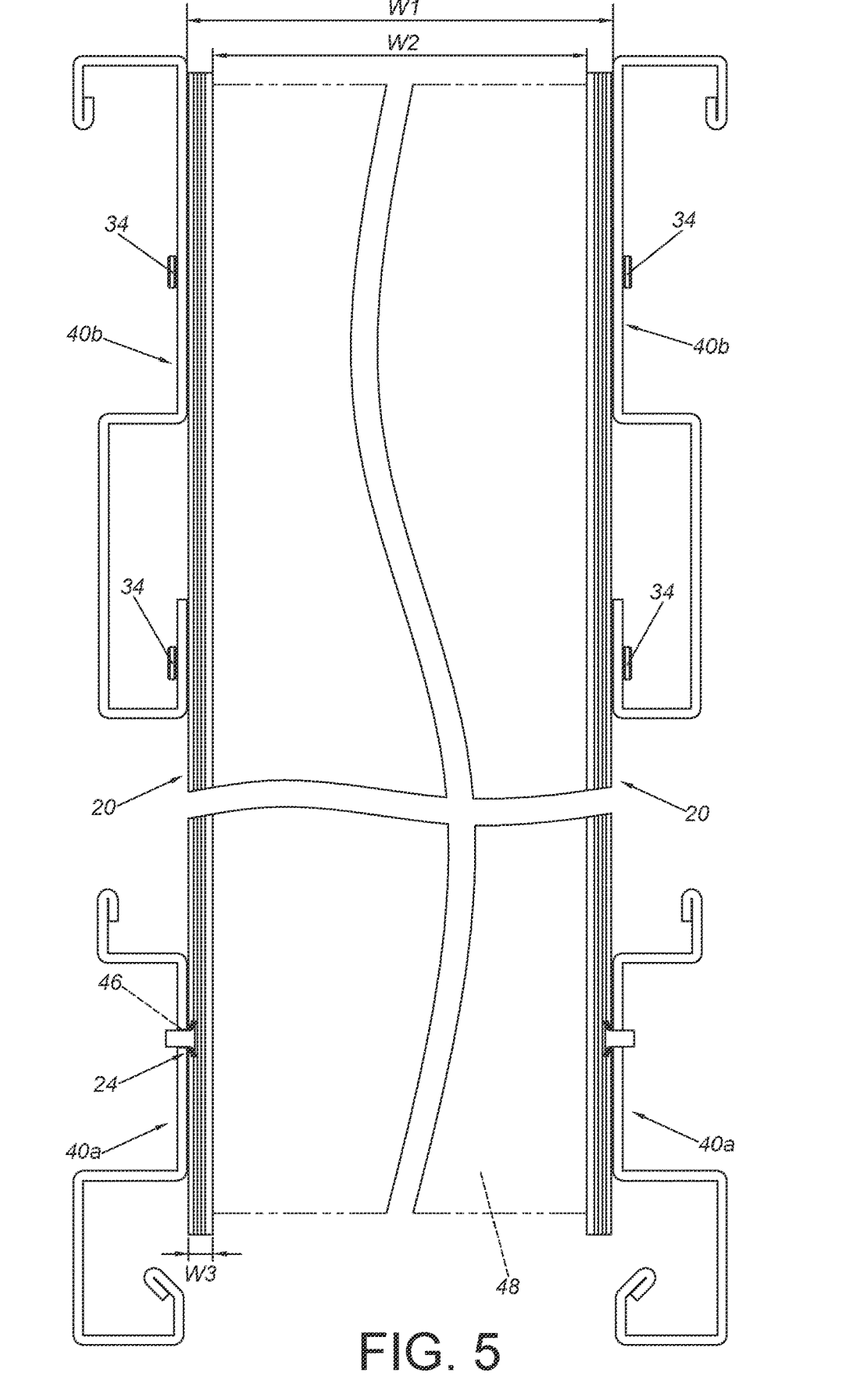
FIG. 5 is a diagram showing two sides of the carried object being mounted to the rack through a pair of the slide rail assemblies according to the first embodiment of the present invention.

As shown in FIG. 5, two sides of the carried object 48 are respectively arranged with the slide rail assemblies 20. Each of slide rail assemblies 20 is mounted to the corresponding first post 40a (or the second post 40b). Moreover, a post distance W1 defined between two of the first posts 40a (or the second posts 40b) of the rack usually meets a predetermined specification width. When the carried object 48 has a carried object width W2 and when a width of the slide rail assembly 20 is not equal to a predetermined width W3, the slide rail assembly 20 must be transversely movable relative to the post in order to fit the carried object width W2 within the post distance W1.

Figure 6:
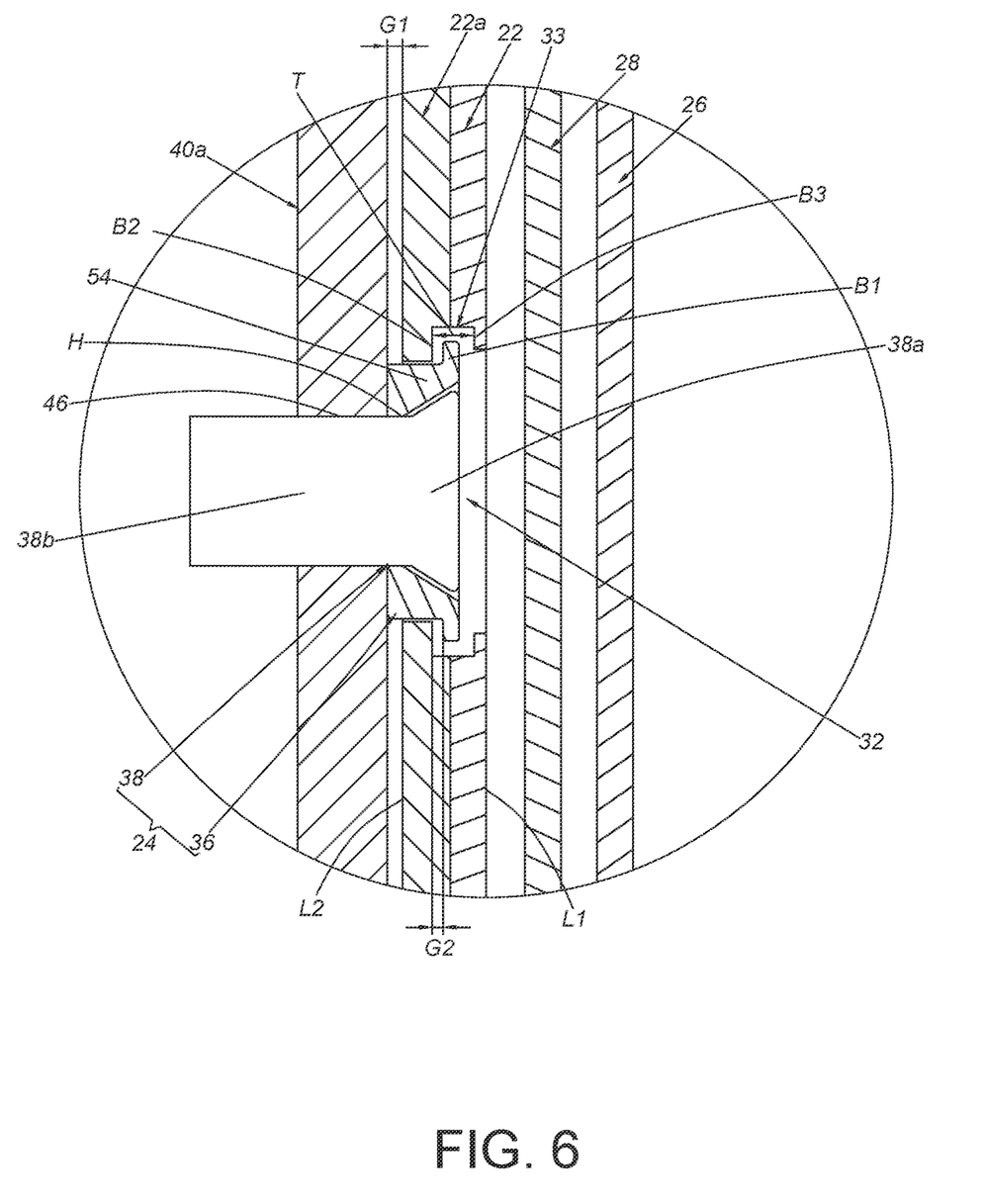
FIG. 6 is a diagram showing the slide rail assembly being mounted to the rack through a mounting structure according to the first embodiment of the present invention.

As shown in FIG. 6, the reinforcing member 22a is regarded as one part of the rail member 22, and the installation holes 32, 32a are regarded as the same installation hole 32. The installation hole 32 of the rail member 22 is communicated with a first side L1 and a second side L2 of the longitudinal body 30. In the present embodiment, the installation hole 32 of the rail member 22 is configured to transversely penetrate through the longitudinal body 30.

Moreover, one of the rail member 22 and the mounting structure 24 comprises a second blocking feature B2 and a third blocking feature B3. In the present embodiment, the rail member 22 and the reinforcing member 22a respectively comprise the third blocking feature B3 and the second blocking feature B2, but the present invention is not limited thereto. The rail member 22 can comprise both the second blocking feature B2 and the third blocking feature B3, or the rail member 22 and the reinforcing member 22a can respectively comprise the third blocking feature B3 and the second blocking feature B2. Since the reinforcing member 22a is connected (such as fixedly connected) to the rail member 22 to be regarded as one part of the rail member 22, it can be overall considered that the rail member 22 comprises the second blocking feature B2 and the third blocking feature B3.

Preferably, a transverse width T is defined between the second blocking feature B2 and the third blocking feature B3.

Preferably, the second blocking feature B2 and the third blocking feature B3 are arranged in the installation hole 32 of the rail member 22. For example, the rail member 22 has a groove 33 (or a recessed part) arranged in the installation hole 32, and the second blocking feature B2 and the third blocking feature B3 are two inner walls of the groove 33 (or recessed part), but the present invention is not limited thereto.

On the other hand, the other one of the rail member 22 and the mounting structure 24 comprises a first blocking feature B1 arranged between the second blocking feature B2 and the third blocking feature B3. In the present embodiment, the mounting structure 24 comprises the first blocking feature B1, but the present invention is not limited thereto. A dimension (such as thickness) of the first blocking feature B1 is smaller than the transverse width T. The rail member 22 and the mounting structure 24 are transversely (laterally) movable relative to each other within a limited range through arranging the first blocking feature B1 between the second blocking feature B2 and the third blocking feature B3. As shown in FIG. 6, the mounting structure 24 is connected (such as screwed) to the first post 40a through the connecting part 38. Therefore, in the present embodiment, the rail member 22 is transversely movable relative to the mounting structure 24 within a limited range (refer to FIG. 7 and FIG. 8).

Furthermore, the supporting part 36 of the mounting structure 24 comprises the first blocking feature B1, and the supporting part 36 has a through hole H. The connecting part 38 is configured to be inserted into the installation hole 32 of the rail member 22 and the through hole H of the supporting part 36.

Preferably, the supporting part 36 further comprises a main body part 54, and the first blocking feature B1 is connected to the main body part 54. A contour of the first blocking feature B1 is greater than a contour of the main body part 54, and the through hole H penetrates through the first blocking feature B1 and the main body part 54.

Preferably, the connecting part 38 comprises a head section 38a and a body section 38b connected to the head section 38a. The head section 38a is greater than the body section 38b. The body section 38b of the connecting part 38 is inserted into the installation hole 32 of the rail member 22 and the through hole H of the supporting part 36. The body section 38b of the connecting part 38 is configured to be connected (such as screwed) to the screw hole 46 of the first post 40a. The supporting part 36 is sleeved on an outer periphery of the head section 38a of the connecting part 38, and the supporting part 36 is configured to provide support between a wall surface of the first post 40a and the head section 38a of the connecting part 38.

Figure 7:
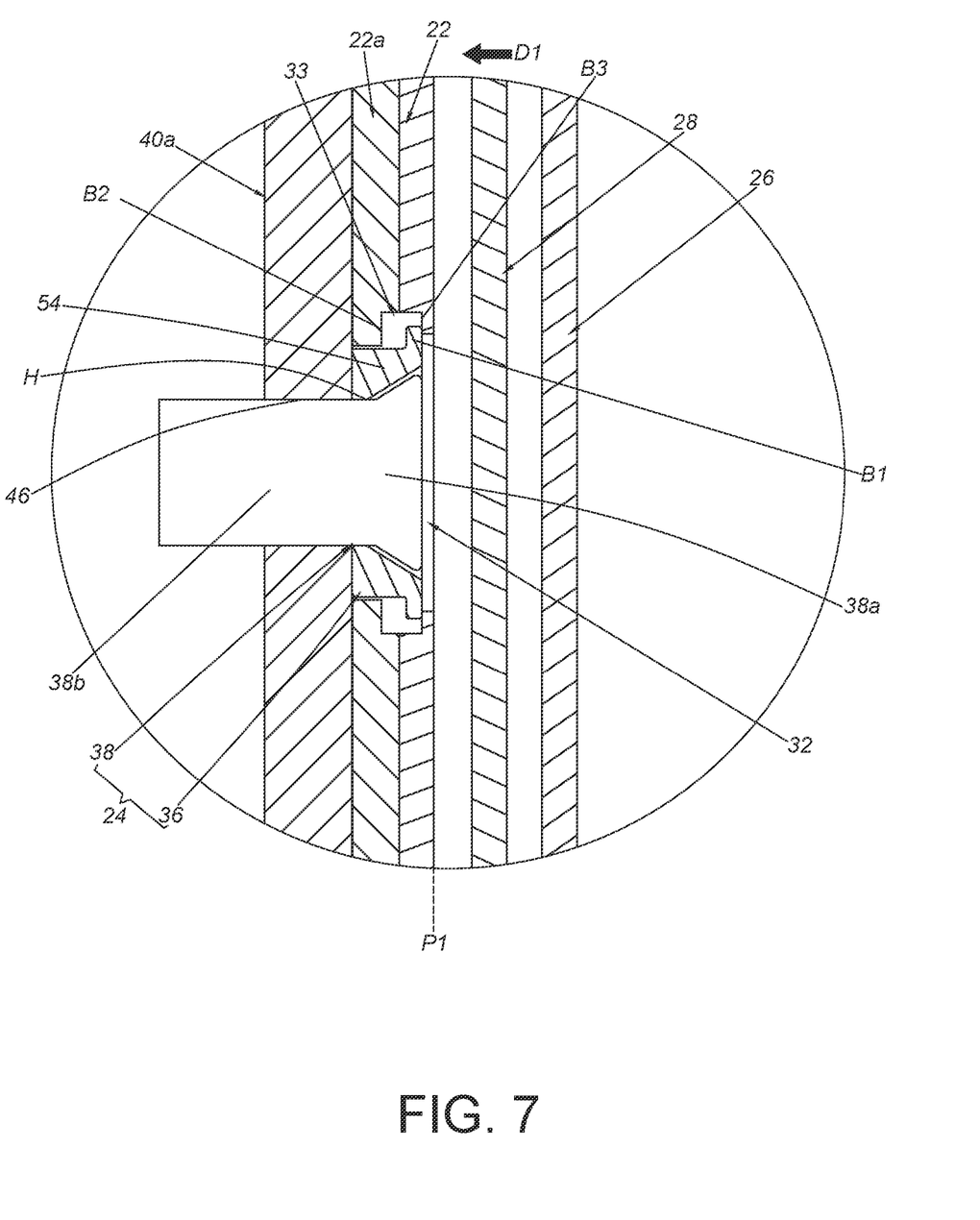
FIG. 7 is a diagram showing the slide rail assembly being mounted to the rack through the mounting structure with a rail member of the slide rail assembly being located at a first predetermined position according to the first embodiment of the present invention.

As shown in FIG. 6 and FIG. 7, the rail member 22 and the mounting structure 24 are transversely movable relative to each other within a limited range through arranging the first blocking feature B1 between the second blocking feature B2 and the third blocking feature B3. In the present embodiment, the rail member 22 (and the reinforcing member 22a) is transversely moved a first distance G1 relative to the connecting part 38 of the mounting structure 24 along a first direction D1 to a first predetermined position P1 (as shown in FIG. 7). Overall, the rail member 22 (and the reinforcing member 22a) can be transversely moved to the first predetermined position P1 through the supporting part 36 of the mounting structure 24, such that the rail member 22 can be considered to be mounted at the first predetermined position P1 by the connecting part 38.

Figure 8:
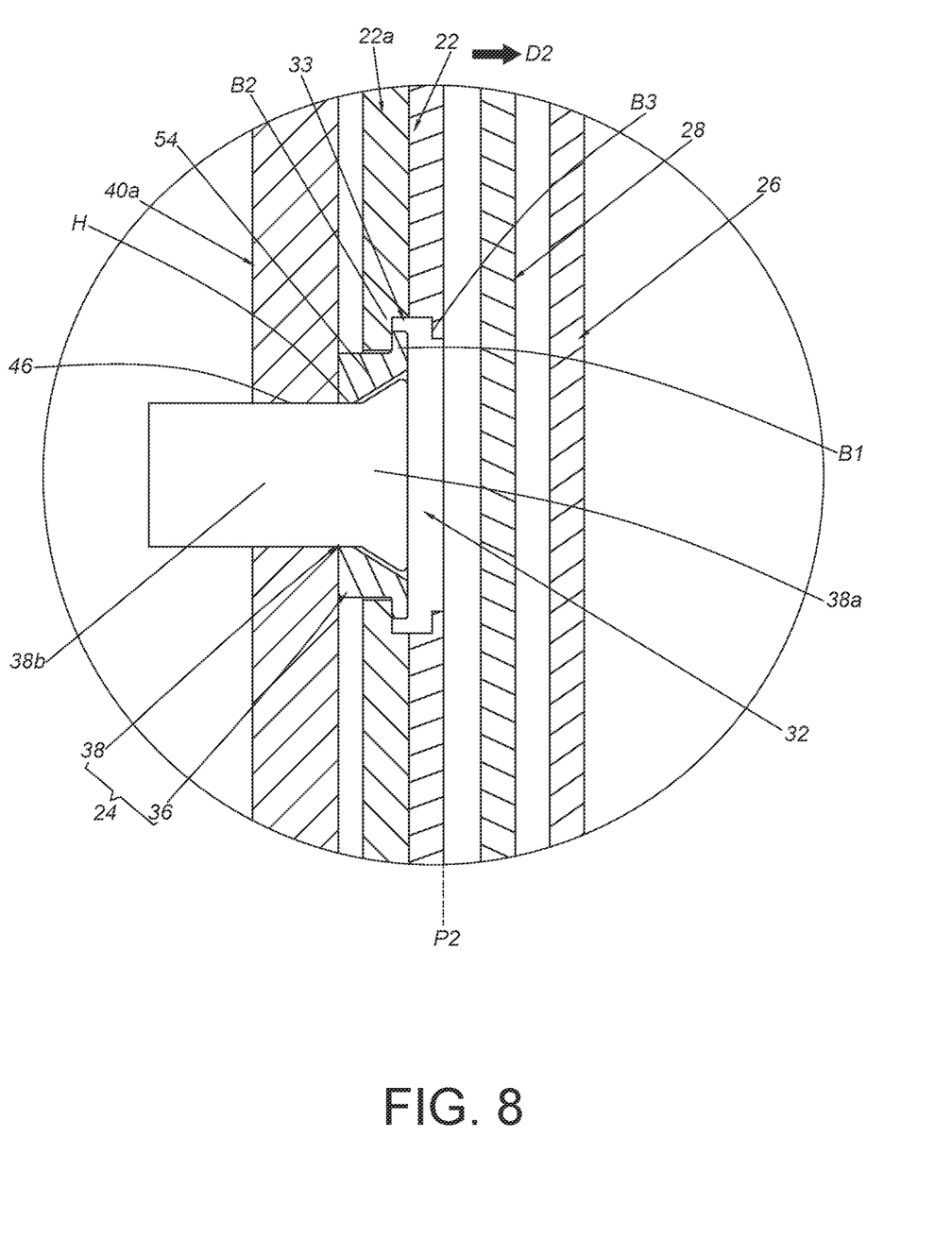
FIG. 8 is a diagram showing the slide rail assembly being mounted to the rack through the mounting structure with the rail member of the slide rail assembly being located at a second predetermined position according to the first embodiment of the present invention.

As shown in FIG. 6 and FIG. 8, the rail member 22 and the mounting structure 24 are transversely movable relative to each other within a limited range through arranging the first blocking feature B1 between the second blocking feature B2 and the third blocking feature B3. In the present embodiment, the rail member 22 (and the reinforcing member 22a) is transversely moved a second distance G2 relative to the connecting part 38 of the mounting structure 24 along a second direction D2 opposite to the first direction D1 to a second predetermined position P2 (as shown in FIG. 8). Overall, the rail member 22 (and the reinforcing member 22a) can be transversely moved to the second predetermined position P2 through the supporting part 36 of the mounting structure 24, such that the rail member 22 can be considered to be mounted at the second predetermined position P2 by the connecting part 38.

Therefore, in one case, for a specific market requirement of mounting another carried object (such as a second carried object) having a width greater than the carried object width W2 of the carried object 48 (the first carried object shown in FIG. 5) to the rack, a user can adjust the rail member 22 to move to the first predetermined position P1 (as shown in FIG. 7). Or, in another case, for a specific market requirement of mounting another carried object (such as a third carried object) having a width smaller than the carried object width W2 of the carried object 48 (the first carried object shown in FIG. 5) to the rack, the user can adjust the rail member 22 to move to the second predetermined position P2 (as shown in FIG. 8).

Moreover, when the mounting structure 24 has not been connected (such as screwed) to the first post 40a, the rail member 22 and the mounting structure 24 are transversely (laterally) movable relative to each other within a limited range through arranging the first blocking feature B1 between the second blocking feature B2 and the third blocking feature B3.

Figure 9:
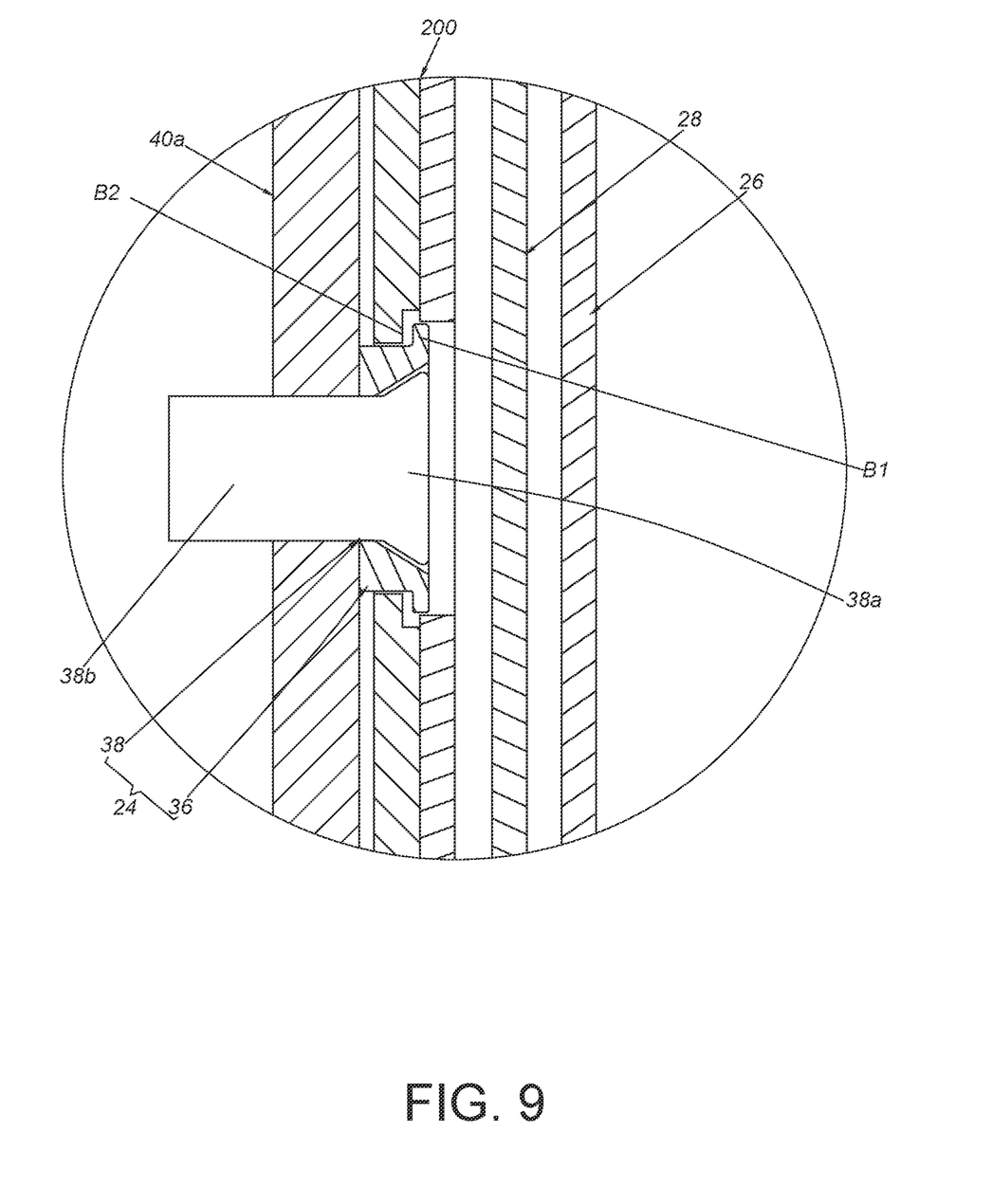
FIG. 9 is a diagram showing a slide rail assembly being mounted to the rack through the mounting structure according to a second embodiment of the present invention.

FIG. 9 is a diagram showing a slide rail assembly according to a second embodiment of the present invention. Different from the first embodiment, a rail member 200 of the second embodiment does not comprise the third blocking feature B3 of the first embodiment. Moreover, the second blocking feature B2 of the rail member 200 is arranged between the target object (such as the wall surface of the first post 40a) and the first blocking feature B1 of the supporting part 36 of the mounting structure 24. According to such arrangement, the rail member 200 can also be transversely movable within a limited range. Furthermore, since the rail member 200 does not comprise the third blocking feature B3, the supporting part 36 and the connecting part 38 of the mounting structure 24 can be provided as a kit for mounting the rail member 200 to the target object (such as the first post 40a) when needed.

Figure 10:
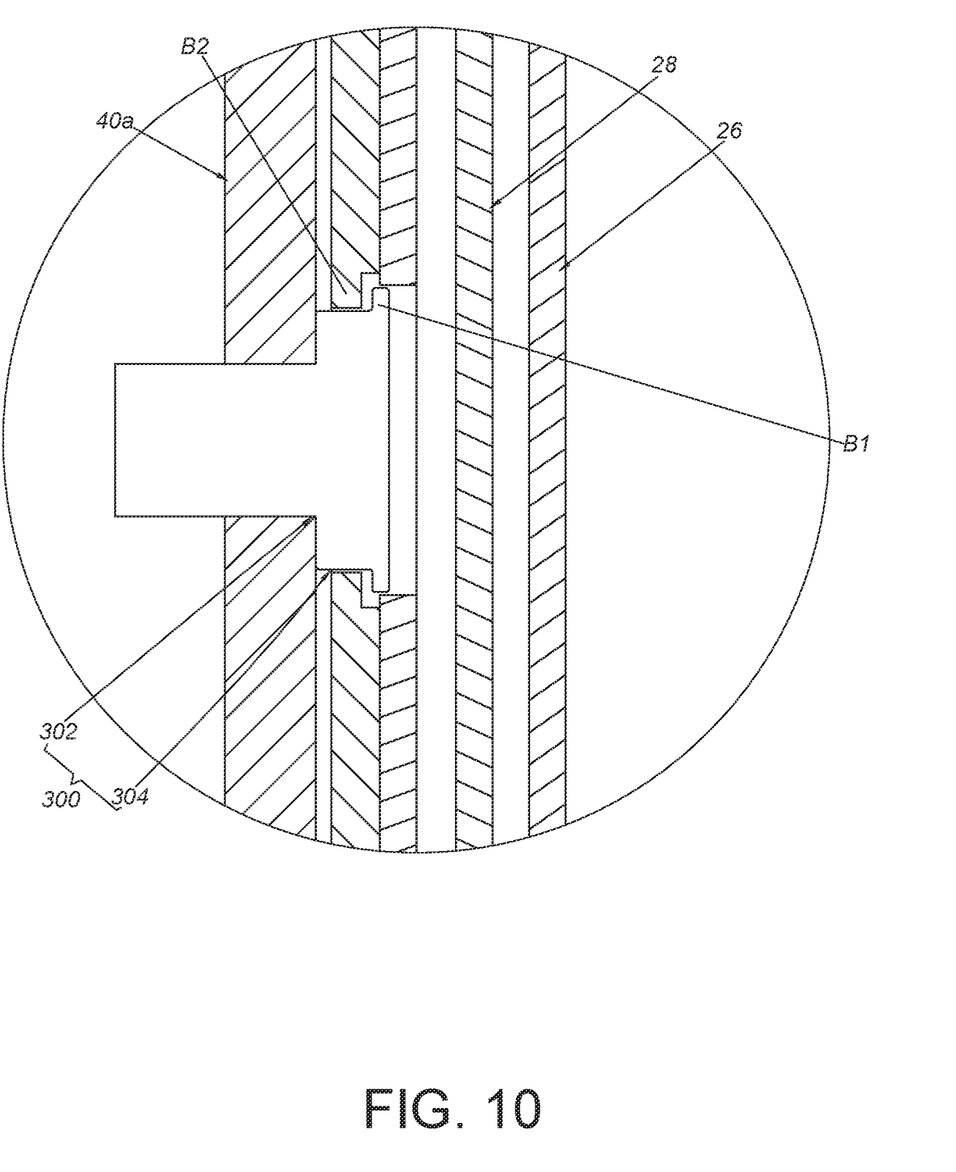
FIG. 10 is a diagram showing a slide rail assembly being mounted to the rack through the mounting structure according to a third embodiment of the present invention.

FIG. 10 is a diagram showing a slide rail assembly according to a third embodiment of the present invention. Different from the first embodiment, a connecting part 302 and a supporting part 304 of a mounting structure 300 of the third embodiment are integrated into one component. Furthermore, the component is a bolt-like component. For example, the mounting structure 300 comprises the connecting part 302 and the supporting part 304 integrally formed, and the supporting part 304 is greater than the connecting part 302. According to such arrangement, the mounting structure 300 can have a simple structure to provide the same effect as the first embodiment or the second embodiment.

Therefore, the slide rail assembly according to the embodiments of the present invention is characterized in that:
1. The rail member 22 has the installation feature arranged in the transverse direction relative to the longitudinal direction of the rail member 22, and the mounting structure 24 is mounted to the installation feature of the rail member 22. When the rail member 22 is mounted to a target object (such as the first post 40a) through the mounting structure 24, the rail member 22 is transversely movable relative to the mounting structure 24.
2. The user can adjust the transverse position of the rail member 22 to fit the carried objects with different widths within the post distance W1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail system comprising:
a rack comprising at least one pair of posts having a plurality of corresponding features;
a carried object; and
a pair of slide rail assemblies configured to be mounted to the rack, each of the slide rail assemblies comprising:
a rail member having a first longitudinal body;
an inner rail longitudinally movable relative to the rail member and configured to contact and carry the carried object;
a middle rail movably mounted between the rail member and the inner rail; and
a reinforcing member fixedly connected to the rail member, wherein the reinforcing member has a second longitudinal body, and the reinforcing member is arranged with a plurality of supporting features on the second longitudinal body, the plurality of supporting features are configured to be mounted to the plurality of corresponding features of the corresponding post;
wherein the first longitudinal body of the rail member and the second longitudinal body of the reinforcing member are respectively arranged with installation features communicated with other, and a mounting structure is connected to the installation features in order to mount the rail member to the rack;
wherein the mounting structure comprises a first blocking feature, and the reinforcing member comprises a second blocking feature, the second blocking feature is arranged between a wall surface of the corresponding post and the first blocking feature, in order to allow the rail member to be transversely movable within a limited range relative to the corresponding post;
wherein the mounting structure comprises a connecting part and a supporting part, the connecting part is configured to be fixed to the corresponding post to mount the rail member to the rack, a diameter of the supporting part is greater than a diameter of the connecting part;
wherein when the connecting part is fixed to the corresponding post, the supporting part penetrates through the installation feature of the second longitudinal body of the reinforcing member to contact and abut against the wall surface of the corresponding post, and a first gap is formed between the wall surface of the corresponding post and the second longitudinal body of the reinforcing member and a second gap is formed between the first blocking feature and the second blocking feature in order to fit the carried object carried by the inner rail within a predetermined distance defined between the posts through transversely moving the rail member relative to the corresponding post;
wherein a summation of widths of the pair of the slide rail assemblies and the carried object is smaller than the predetermined distance defined between the posts.

2. The slide rail system of claim 1, wherein the supporting features are protrusions, and the corresponding features are holes.

3. The slide rail system of claim 2, wherein the connecting part and the supporting part are two separate and independent components.

4. The slide rail system of claim 2, wherein the connecting part and the supporting part are integrated into one component.

5. The slide rail system of claim 1, wherein each of the posts has a plurality of connecting features, and the reinforcing member is arranged with a plurality of mounting features on the second longitudinal body, the plurality of mounting features are configured to be mounted to the plurality of connecting features.

6. The slide rail system of claim 5, wherein each of the mounting features comprises a first mounting part and a second mounting part connected to the first mounting part, and a diameter of the first mounting part is greater than a diameter of the second mounting part; wherein each of the connecting features comprises a first hole part and a second hole part communicated with the first hole part, and a diameter of the first hole part is greater than a diameter of the second hole part.

7. The slide rail system of claim 1, wherein when each of the slide rail assemblies is mounted to the rack, a distance between an outer surface of the first longitudinal body of the rail member and the wall surface of the corresponding post is greater than a distance between the first blocking feature and the wall surface of the corresponding post.

8. The slide rail system of claim 1, wherein when each of the slide rail assemblies is mounted to the rack, the first blocking feature is located inside the installation features without protruded from the first longitudinal body of the rail member.

* * * * *